(12) United States Patent
Goren et al.

(10) Patent No.: US 6,459,337 B1
(45) Date of Patent: Oct. 1, 2002

(54) SYSTEM AND METHOD FOR NOISE AND SPURIOUS SUPPRESSION IN POWER AMPLIFIER SYSTEMS

(75) Inventors: Yehuda G. Goren, Palo Alto; Charles E. Jensen, Carmichael; Donald R. Gagne, Placerville; Philip M. Lally, Palo Alto; David Zavadil, Cameron Park, all of CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 65 days.

(21) Appl. No.: 09/609,842

(22) Filed: Jul. 5, 2000

(51) Int. Cl.$^7$ ............................. H03F 3/58; H03F 1/26
(52) U.S. Cl. ......................... 330/43; 330/136; 330/149
(58) Field of Search .......................... 330/43, 136, 149; 315/3.5, 39.3

(56) References Cited

U.S. PATENT DOCUMENTS

| | | | |
|---|---|---|---|
| 4,134,114 A | 1/1979 | Riggs et al. | 343/17.2 R |
| 4,197,540 A | 4/1980 | Riggs et al. | 343/17.2 R |
| 4,600,892 A | 7/1986 | Wagner et al. | 330/144 |
| 5,148,117 A | 9/1992 | Talwar | 330/151 |
| 5,182,524 A * | 1/1993 | Hopkins | 330/136 X |
| 5,608,331 A | 3/1997 | Newberg et al. | 324/613 |
| 5,760,646 A | 6/1998 | Belcher et al. | 330/149 |
| 5,930,688 A | 7/1999 | Floyd et al. | 455/116 |
| 6,177,836 B1 * | 1/2001 | Young et al. | 330/43 |
| 6,285,254 B1 * | 9/2001 | Chen et al. | 330/149 |

OTHER PUBLICATIONS

Muhonen et al., "Amplifier Linearization for the Local Multipoint Distribution System Application," *IEEE Personal, Mobile, Indoor and Radio Communication Conference*, Boston, MA, Sep. 1998.

* cited by examiner

Primary Examiner—Steven J. Mottola
(74) *Attorney, Agent, or Firm*—Kirkpatrick & Lockhart LLP

(57) ABSTRACT

An amplifier system, including a vacuum tube amplifier having an input signal terminal and an output signal terminal, and a phase noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of an electron source of the vacuum tube amplifier and an interaction region of the vacuum tube amplifier. The amplifier system may also, or alternatively, include an amplitude noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of a focusing electrode of the electron source and a grid of the electron source.

51 Claims, 13 Drawing Sheets

SYSTEM AND METHOD FOR NOISE AND SPURIOUS SUPPRESSION IN POWER AMPLIFIER SYSTEMS

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF INVENTION

1. Field of Invention

The present invention relates generally to power amplifiers and, more particularly, to circuits and methods for suppression of noise and spurious signals in power amplifiers systems.

2. Description of the Background

In communications systems using electromagnetic radiation, the reception quality of the received signal is related to the signal to noise ratio (SNR), i.e., the ratio of the signal strength to the noise level at the receiver. Typically, the amount of noise introduced by the power amplifier at the transmitter is negligible compared to the thermal noise at the receiver. This is especially true for long range applications, such as on the order of hundreds of miles or more. Consequently, it is ordinarily not necessary to utilize noise suppression techniques at the transmitter. Rather, to improve the SNR, it is often sufficient to merely increase signal power at the transmitter.

However, for short range applications, the amount of noise introduced at the transmitter becomes increasingly important. This is because the noise introduced by the transmitter may approach, or even exceed, the thermal noise floor at the receiver. Moreover, for narrow band applications, such as with radar systems, the SNR cannot be improved merely by increasing the signal power from the transmitter because of the non-linearity of the power amplifier at saturation, which may cause intolerable spectral regrowth (mostly in pulse modulated radar systems). Moreover, because noise is random, pre-distortion techniques cannot be used.

Accordingly, there exists a need for a manner to suppress noise and other spurious signals in a power amplifier. There further exists a need for a manner to inexpensively suppress noise and other spurious signals in a cascaded amplifier system.

BRIEF SUMMARY OF INVENTION

The present invention is directed to an amplifier system. According to one embodiment, the amplifier system includes a vacuum tube amplifier having an input signal terminal and an output signal terminal, and a phase noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of an electron source of the vacuum tube amplifier and an interaction region of the vacuum tube amplifier.

According to another embodiment, the amplifier system includes a vacuum tube amplifier having an input signal terminal, an output signal terminal, and an electron source, and an amplitude noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to the electron source of the vacuum tube amplifier.

According to another embodiment, the amplifier system includes a first amplifier having an input signal terminal and an output signal terminal, a second amplifier having an input signal terminal and an output signal terminal, wherein the input signal terminal is coupled to the output signal terminal of the first amplifier, and a phase noise suppression circuit having first and second input terminals and an output terminal, wherein the first input terminal is coupled to the input signal terminal of the first amplifier, the second input terminal is coupled to the output signal terminal of the second amplifier, and the output terminal is coupled to the first amplifier.

According to yet another embodiment, the amplifier system includes a first amplifier having an input signal terminal and an output signal terminal, a second amplifier having an input signal terminal and an output signal terminal, wherein the input signal terminal is coupled to the output signal terminal of the first amplifier, and an amplitude noise suppression circuit having first and second input terminals and an output. terminal, wherein the first input terminal is coupled to the input signal terminal of the first amplifier, the second input terminal is coupled to the output signal terminal of the second amplifier, and the output terminal is coupled to the first amplifier.

In contrast to prior techniques, the present invention provides an efficient and inexpensive technique for suppressing noise and other spurious signals for vacuum tube amplifiers. Moreover, the techniques of the present invention are applicable for amplifier systems having two or more cascaded amplifiers. These and other benefits of the present invention will be apparent from the detailed description of the invention hereinbelow.

DESCRIPTION OF THE FIGURES

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements of a conventional power amplification system. Those of ordinary skill in the art will recognize that those and other elements may be desirable. However, because such elements are well known in the art, and because they do not facilitate a better understanding of the present invention, a discussion of such elements is not provided herein.

Figure 1:
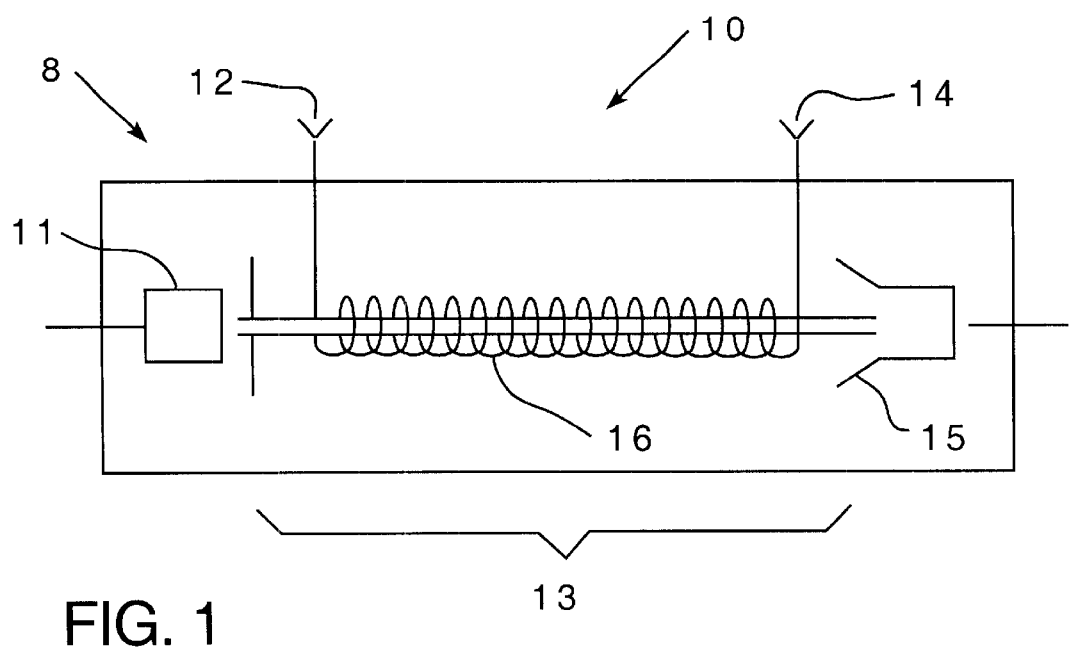
FIG. 1 is a schematic diagram of one type of a vacuum tube amplification device.

FIG. 1 is a schematic diagram of one type of a vacuum tube device 8 including an evacuated tube 10, a source of electrons 11, an input signal terminal 12 for introducing an input signal, an interaction region 13 where electrons interact with the input signal, and an output signal terminal 14 where an amplified signal emerges from the tube 8. The vacuum tube device 8 may be, for example, a traveling wave tube (TWT), as illustrated in FIG. 1. A TWT typically includes a focusing magnet (not shown) to focus the beam of electrons through the interaction region 13, a collector 15 to collect the electron beam after the output microwave power has been generated, and an internal attenuator (not shown) to absorb microwave power reflected back into the tube from mismatches in the output. Although the present invention will be described in the context of a TWT, the benefits of the present invention may be realized with other vacuum tube devices such as, for example, klystrons and triodes.

The source of electrons 11 may be, for example, an electron gun. An electron gun is a particular kind of electron source which generates, accelerates, and focuses an electron beam so that the beam follows a desired trajectory after it leaves the electron gun. An electron gun is discussed in more detail hereinbelow with respect to FIG. 2.

The input signal terminal 12 receives an input signal to be amplified by the tube device 8, which is typically an amplitude modulated carrier signal. The carrier signal may be, for example, in the microwave frequency range. The carrier signal may be modulated by a data signal, such as a voice data signal having a frequency, for example, in the kHz range, or a video data signal having a frequency, for example, in the MHz range. The carrier signal may also be modulated by other types of data signals. In any event, the frequency of the data signal modulating the carrier signal may be significantly less than the frequency of the carrier signal.

The interactive region 13 is a portion of the tube 8 where the input signal is amplified through interaction with an electron beam. The interaction region 13 may include, for example, a conductive helix 16, as illustrated in FIG. 1, for broadband applications or a coupled-cavity region (not shown) for high power applications. In the case of a conductive helix 16, for example, the electron beam may pass through the helix 16 while the signal to be amplified is conducted on the helix 16, and inductive interactions occur between the signal and the electrons. The signal modulates the electron beam, and the modulated electron beam amplifies the signal. Typically, it is desirable for the signal to be amplified and the electrons to move along the interaction region at the same speed. Noise generated by the tube device 8, however, may introduce a speed deviation between the signal and the electrons.

The output signal terminal 14 is the pathway by which the signal leaves the tube device 8. The signal on the output signal terminal 14 is an amplified version of the input signal that entered the tube device 8 at the input signal terminal 12.

Figure 2:
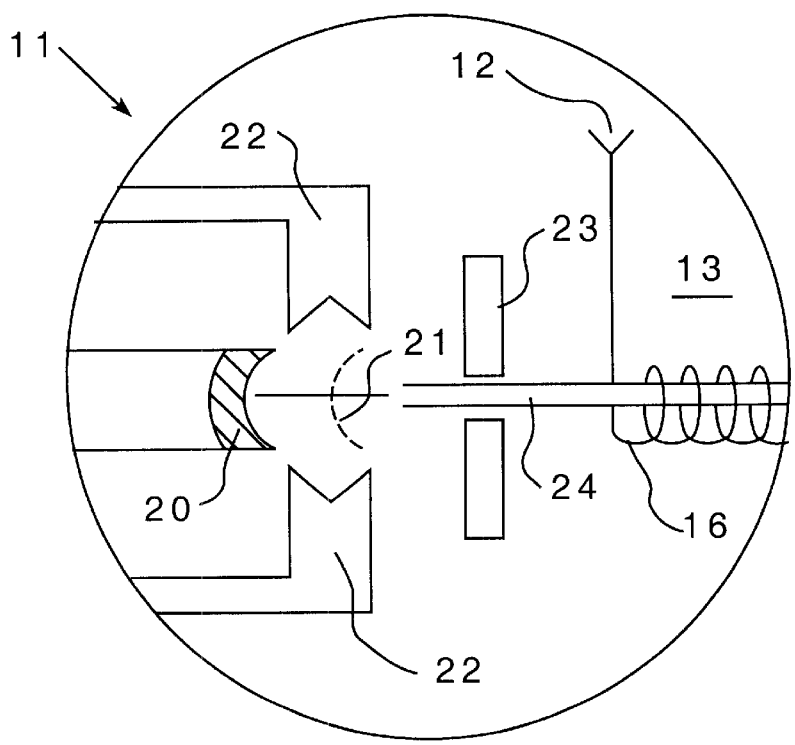
FIG. 2 is a schematic diagram of a source of electrons of the vacuum tube device of FIG. 1.

FIG. 2 is a schematic diagram of a source of electrons 11 in the form of an electron gun according to one embodiment of the present invention. In that embodiment, the source of electrons 11 includes a thermionic cathode 20, one or more grids 21 for inducing emission of electrons, focusing electrodes 22 for focusing the electrons into a beam, and an apertured anode 23 for further directing the electron beam 24 into the interaction region 13. The source of electrons 11 produces an electron beam 24. For TWT applications, a long, thin electron beam 24 at a relatively low voltage and high current density is typically desirable. Electron guns have many embodiments and variations, such as a planar cathode faced by a planar anode to more elaborate designs such as Pierce guns, conical diode electrodes, concentric cylinders, and spherical cap cathodes. According to the present invention, the electron source 11 may be, for example, any such electron gun.

The cathode 20 introduces the electrons into the tube 10. The cathode 20 is typically at a lower voltage relative to the grid(s) 21, the anode 23, and the helix 16. This may be realized, for example, by applying a negative voltage to the cathode 20 such as, for example, −10 kV, and grounding the anode 23 and the helix 16. The voltage potential difference between the cathode 20 and the grid(s) 21 typically is on the order of 100 V.

The voltage potential difference between the cathode 20 and the anode 23 affects the kinetic energy of the electrons emitted by the cathode 20: the greater the voltage potential difference the greater the kinetic energy of the emitted electrons, and the lesser the voltage potential the lesser the kinetic energy of the electrons. The kinetic energy of the emitted electrons may also be increased by providing a voltage potential difference between the cathode 20 and the interaction region 13 of the tube device 8, such as by modulating the voltage potential difference between the cathode 20 and the helix 16 according to, for example, the serrodyne modulation technique. The number of electrons emitted by the cathode 20, which is proportional to the current of the electron beam 24, is related to the voltage potential difference between the cathode 20 and, for example, the focusing electrodes 22 or the grid(s) 21.

Figure 3:
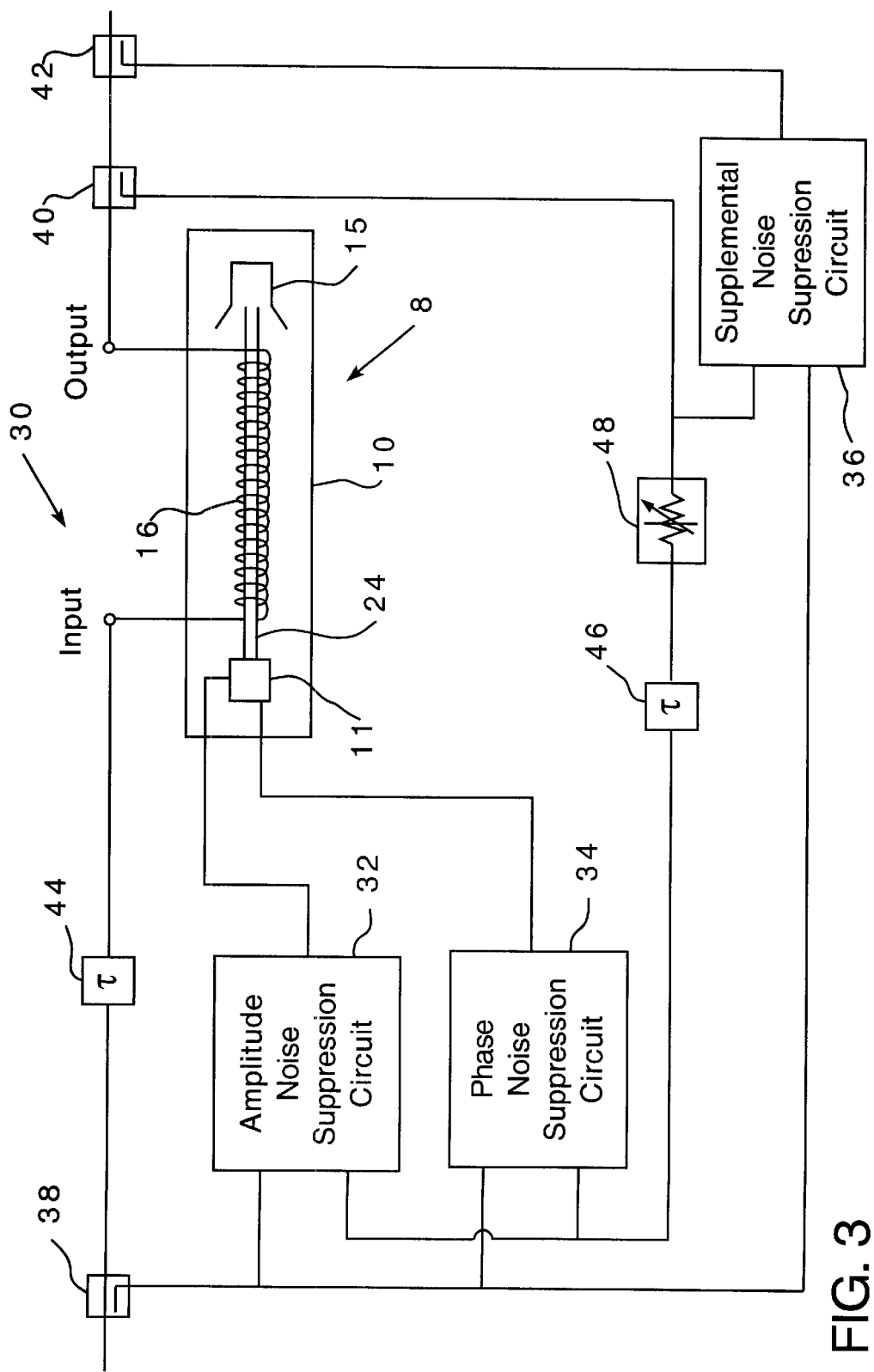
FIGS. 3–14 are combination block/schematic diagrams of an amplifier system according to embodiments of the present invention.

FIG. 3 is a block diagram of an amplifier system 30 according to one embodiment of the present invention. The amplifier system 30 includes the vacuum tube device 8, such as described hereinbefore with respect to FIGS. 1 and 2, an amplitude noise suppression circuit 32, a phase noise suppression circuit 34, and a supplemental noise suppression circuit 36. As illustrated in FIG. 3, each of the amplitude noise suppression circuit 32, the phase noise suppression circuit 34, and the supplemental noise suppression circuit may have input terminals coupled to both the input and the output of the tube device 8. A directional coupler 38 may be used to provide a portion of the input signal to each of these circuits, and a directional coupler 40 may be used to provide a portion of the output signal to each of the circuits.

As illustrated in FIG. 3, the supplemental noise suppression circuit 36 may have an output terminal coupled to the output of the tube device 8 via a directional coupler 42. According to such an embodiment, the supplemental noise suppression circuit 36 may operate according to a feedforward noise suppression technique. According to another embodiment, as described further hereinbelow, the supplemental noise suppression circuit 36 may operate according to a feedback noise suppression technique.

Also as illustrated in FIG. 3, the amplifier system 30 may include a delay line 44 between the input terminal 12 of the tube device 8 and the coupler 38. The purpose of the delay line 42 may be to delay the input signal to compensate for a time delay caused by the circuits 32, 34, and 36. In addition, the amplifier system 30 may include a delay line 46 and an attenuator 48 connected between the coupler 40 and the inputs to each of the amplitude noise suppression circuit 32 and the phase noise suppression circuit 34. The delay line 46 and the attenuator 48 may harmonize the power and delay of the output signal to correspond to that of the input signal. As such, the attenuation provided by the coupler 40 and the attenuator 48 may match the gain of the tube device 8.

The amplitude noise suppression circuit 32 provides compensation for the amplitude noise introduced by the tube device 8. To compensate for the amplitude noise introduced by the tube device 8, the amplitude noise suppression circuit 32 may control the number of electrons emitted by the electron source 11. According to one embodiment, as discussed further hereinbelow, the output terminal of the amplitude noise suppression circuit 34 is coupled to the electron source 11, and controls the current of the electron beam 24 emitted from the electron source by controlling the voltage applied to the focusing electrodes 22 relative to the cathode 20. According to another embodiment, the amplitude noise suppression circuit 32 may control the voltage applied to the grid(s) 21 relative to the cathode 20. Embodiments of the amplitude noise suppression circuit 32 will be described further hereinbelow with respect to FIGS. 8–9.

The phase noise suppression circuit 34 provides compensation for the phase noise introduced by the tube device 8. The output terminal of the phase noise suppression circuit 34 is coupled to the electron source 11 of the tube device 8, and modulates the relative voltages in the electron source 11, such as the voltage of the cathode 20 relative to the anode 23, based on the power level (or envelope) of the input signal to the tube device 8. In that way, the phase noise suppression circuit 34 may adjust the kinetic energy, and hence the velocity, of the electrons emitted by the electron source 11. According to another embodiment, the phase noise suppression circuit 34 modulates voltages of the interaction region 13 of the tube device 8 according to the serrodyne modulation technique to adjust the kinetic energy of electrons emitted by the electron source 11. Different embodiments for the phase noise suppression circuit 34 will be described further hereinbelow with respect to FIGS. 6–7.

The supplemental noise suppression circuit 36 provides additional noise compensation for the tube device 8 by, for example, canceling the noise components introduced by the tube device 8 when amplifying the input signal at either the input or the output of the tube device 8. As discussed hereinbelow with respect to FIGS. 10–12, the supplemental noise suppression circuit 36 may provide additional noise compensation according to, for example, a feedforward technique or a feedback technique.

Although the present invention will be described herein as including each of the amplitude noise suppression circuit 32, the phase noise suppression circuit 34, and the supplemental noise suppression circuit 36, the noise suppression benefits of the present invention may be realized, for example, with only one or any combination of two of these circuits.

Figure 4:
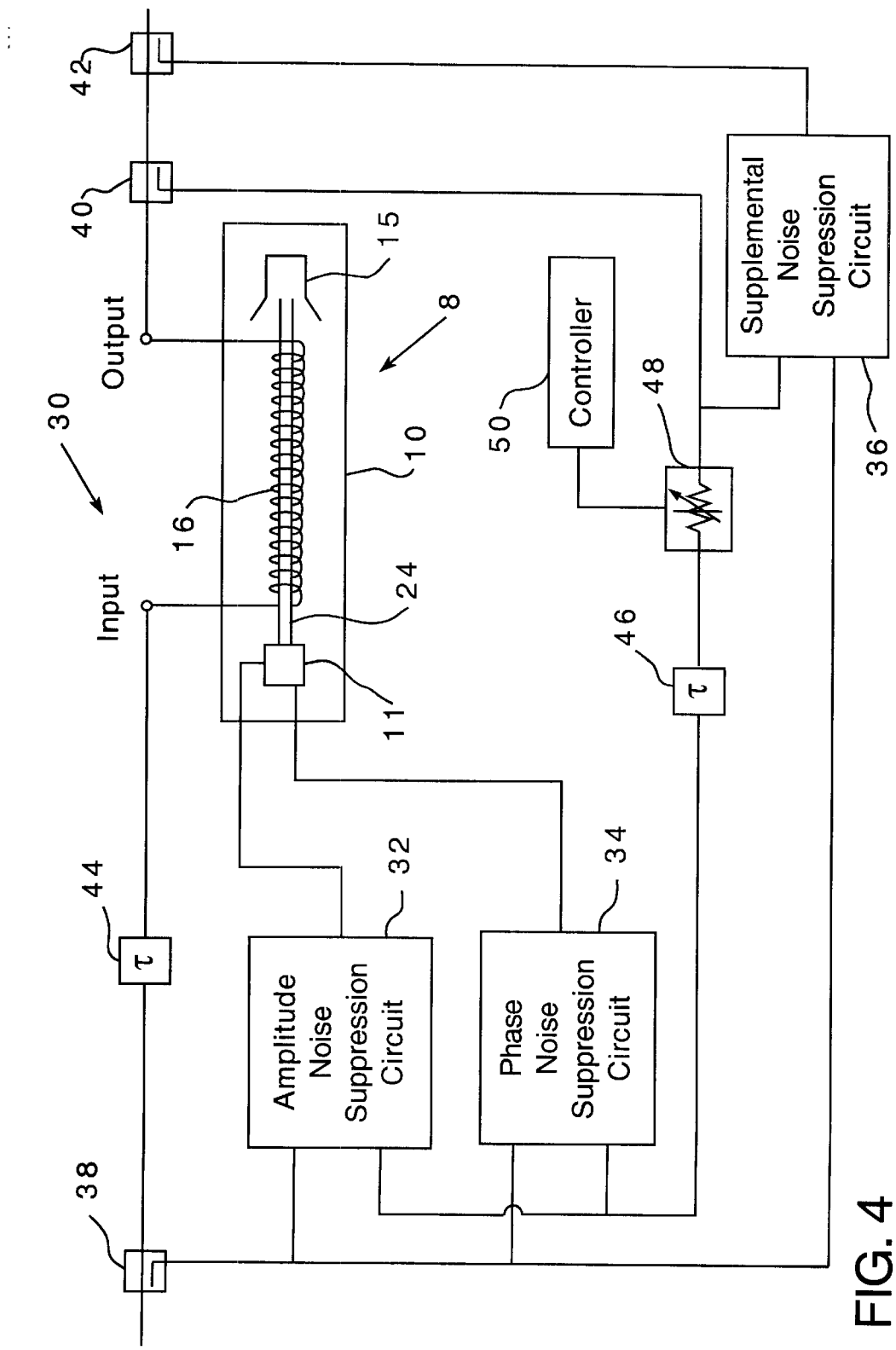
Figure 5:
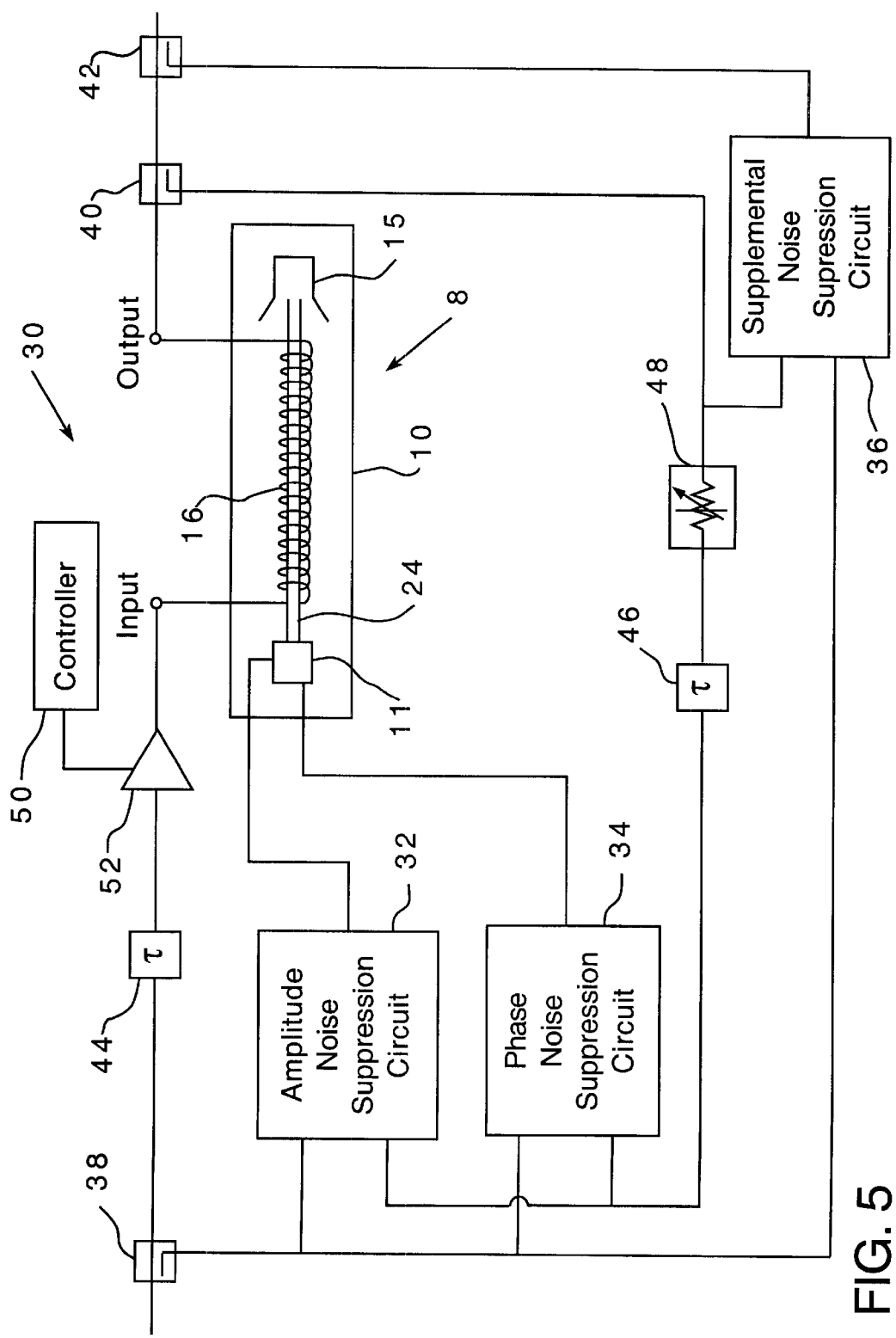

FIGS. 4 and 5 are diagrams of the amplifier system 30 according to other embodiments of the present invention. In FIG. 4, the attenuation provided by the attenuator 48 may be adaptively varied to correspond to the gain provided by the tube device 8 so that the input and output signals are harmonized with respect to signal strength. According to such an embodiment, the attenuation provided by the attenuator 48 and the coupler 40 should match the gain of the tube device 8. The input and output signals of the tube device 8 may be sampled by a controller 50 to determine the gain of the tube device 8. The controller 50 may output a signal to the attenuator 48 to adaptively adjust the attenuation provided by the attenuator 48 to compensate for any variance in the gain provided by the tube device 8.

According to another embodiment, illustrated in FIG. 5, the attenuator 48 is a fixed attenuator, and a pre-amplifier 52 is provided at the input of the tube device 8. The gain provided by the pre-amplifier 52 may be adjusted so that the attenuation provided by the attenuator 48 and the coupler 40 matches the gain provided by the tube device 8 and the pre-amplifier 52. According to such an embodiment, the input and output signals of the tube device 8 may be sampled by the controller 50 to determine the gain of the tube device 8. The controller 50 may output a signal to the pre-amplifier 52 to adaptively adjust the gain provided by the pre-amplifier 52 to compensate for any variance in the gain provided by the tube device 8. The pre-amplifier 52 may be, for example, a solid-state amplifier. Accordingly, where, for example, the gain provided by the tube device 8 drops by 2 dB, the gain of the pre-amplifier 52 may be adjusted to provided 2 dB of gain such that the signals input to the amplitude noise suppression circuit 32 and the phase noise suppression circuit 34 are of substantially the same signal strength.

Figure 6:
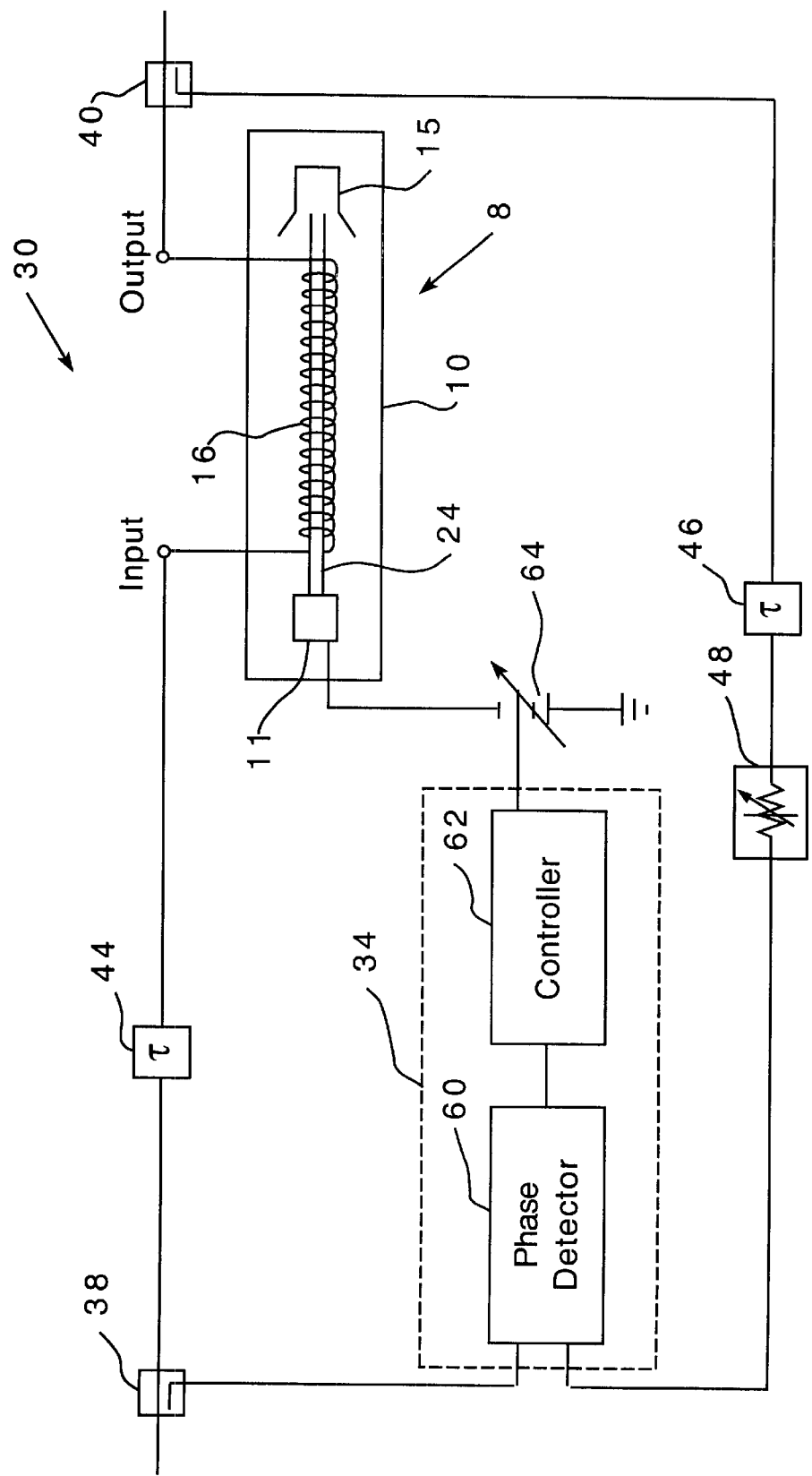
Figure 7:
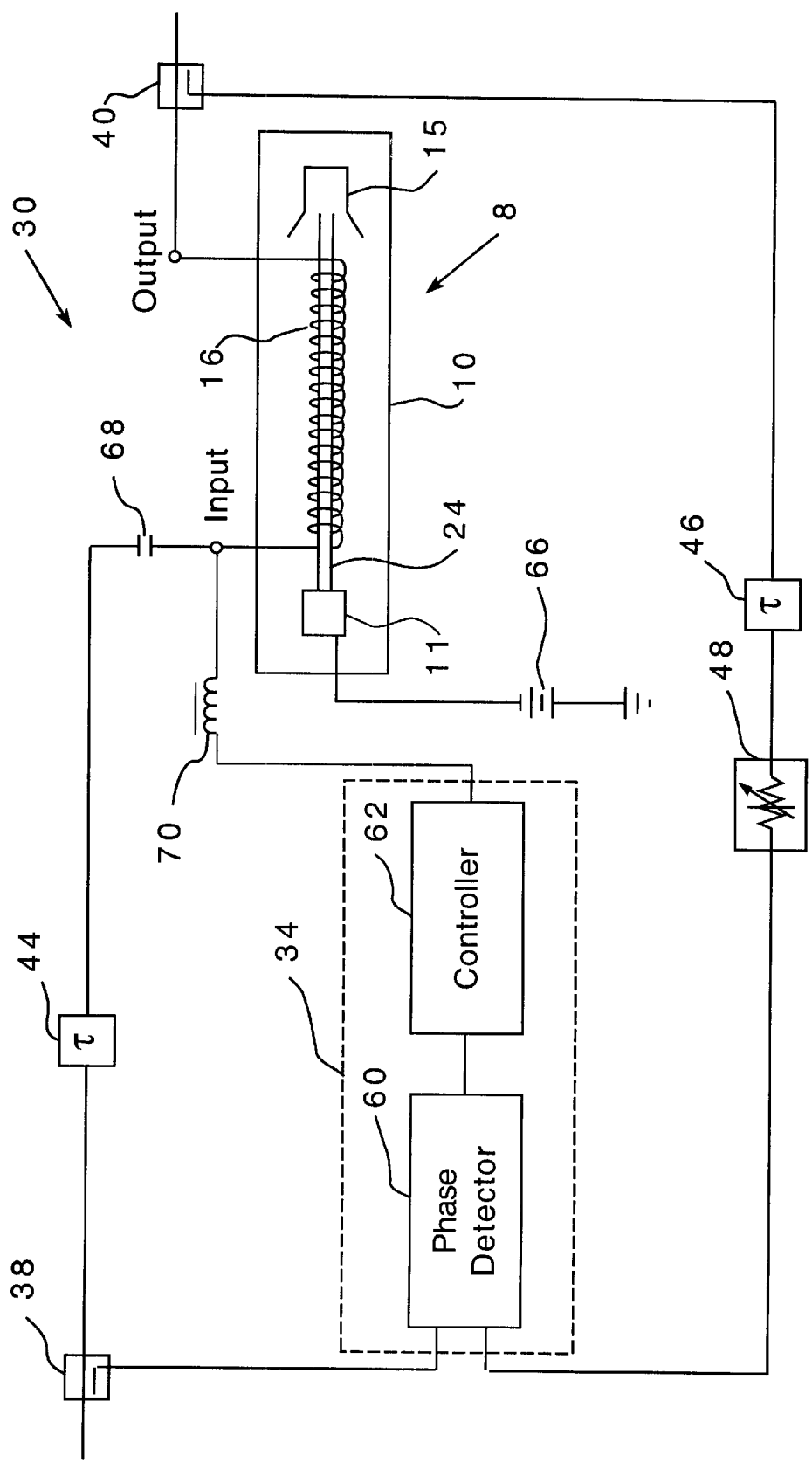

FIGS. 6–7 are diagrams of the amplifier system 30 of the present invention showing different embodiments for the phase noise suppression circuit 34. For purposes of clarity, the amplitude noise suppression circuit 32 and the supplemental noise suppression circuit 36 are not illustrated in FIGS. 6–7. In FIG. 6, the phase noise suppression circuit 34 includes a phase detector 60 and a controller 62. The output of the phase noise suppression circuit 34 is connected to a variable power source 64, which is connected to the electron source 11 of the tube device 8. The phase noise suppression circuit 34 modulates the relative voltages in the electron source 11, such as the voltage of the cathode 20 relative to the anode 23, via the variable power source 64, based on the phase difference between the input and output signals of the tube device 8. In that way, the phase noise suppression circuit 34 may adjust the kinetic energy, and hence the velocity, of the electrons emitted by the electron source 11, thereby compensating for the phase noise introduced by the tube device 8.

The phase detector 60 includes an input terminal coupled to each of the input signal and the output signal of the tube device 8, and outputs a signal, such as a DC voltage signal, indicative of the phase difference between the two signals. The phase detector 60 may be, for example, embodied as a hybrid circuit including, for example, a fast step recovery diode, two coupling capacitors and a matched Schottky diode pair.

The controller 62 receives the signal from the phase detector 60 and generates a control signal that is provided to the variable power source 64. The controller 62 may be either a digital device or an analog device, and the control signal output from the controller 62 may be an analog voltage signal or a digital signal. For an embodiment in which the controller 62 is an analog device, the controller 62 may be, for example, a solid state amplifier, such as a low noise solid state amplifier. For an embodiment in which the controller 62 is a digital device, the controller 50 may be, for example, a digital signal processor (DSP) or an application specific integrated circuit (ASIC), programmed to map the output signal of the phase detector 60 to the appropriate control signal to be supplied to the variable power source 64 such that the appropriate voltage is applied to the electron source 11 to suppress phase noise introduced by the tube device 8.

The variable power source 64 provides variable power to the electron source 11 based on the control signal provided by the controller 62, which is a function of the phase difference between the input and output signals of the tube device 8.

FIG. 7 is a diagram of the amplifier system 30 illustrating another embodiment of the phase noise suppression circuit 34. According to the illustrated embodiment, a non-variable power source 66 is connected to the electron source 11 of the tube device 8. In addition, the input signal to the tube device 8 is coupled to the helix 16 of the interaction region 13 of the tube device 8 via a capacitor 68. The output signal of the phase noise suppression circuit 34 is also coupled to the helix 16 via a choke 70 according to, for example, a serrodyne modulation technique. The control signal output from the phase noise suppression circuit 34 may be a low frequency voltage signal, which is applied to the helix 16, such that the voltage signal applied to the helix 16 causes the electrons emitted by the electron source 11 to accelerate at an increased rate to compensate for the phase noise introduced by the tube device 8. Thus, the voltage of the helix 16 may be modulated relative to the voltage of the cathode 20 according to the serrodyne modulation technique.

The capacitor 68 isolates the low frequency control signal output from the phase noise suppression circuit 34 from the high frequency input signal, and the choke 70 isolates the phase noise suppression circuit 34 from the high frequency input signal. In addition, the choke 70 may isolate the tube device 8 from spurious high frequency signals generated by the phase noise suppression circuit 34. Consequently, the amplifier system 30 illustrated in FIG. 7 operates to suppress phase noise introduced by the tube device 8 in a fashion similar to the amplifier system 30 illustrated in FIG. 6, except that instead of applying an increased negative voltage to the cathode 20 relative to the anode 23 to enhance the acceleration of the electrons emitted by the electron source 11, an increased positive voltage is applied to the helix 16 relative to the cathode 20.

Figure 8:
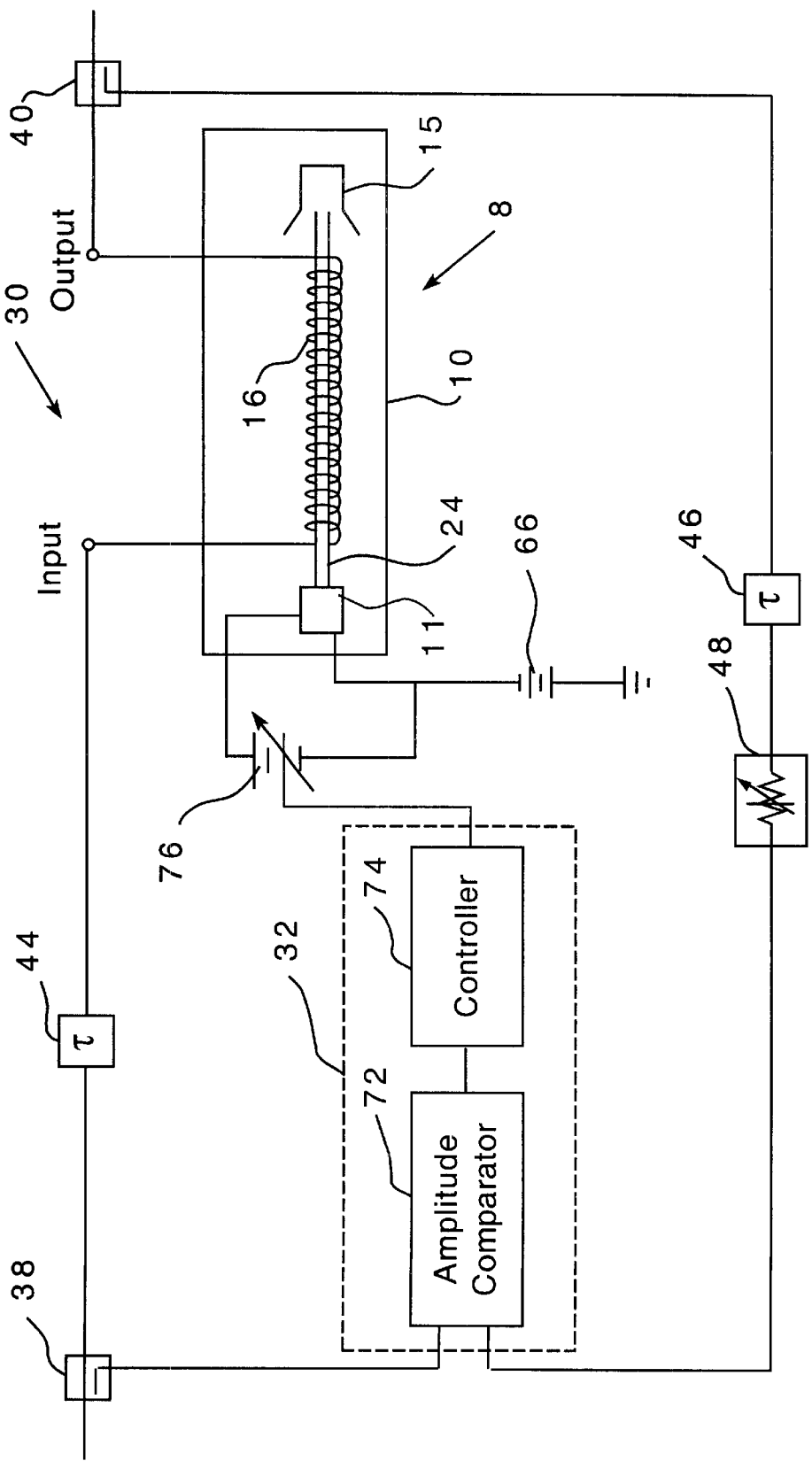
Figure 9:
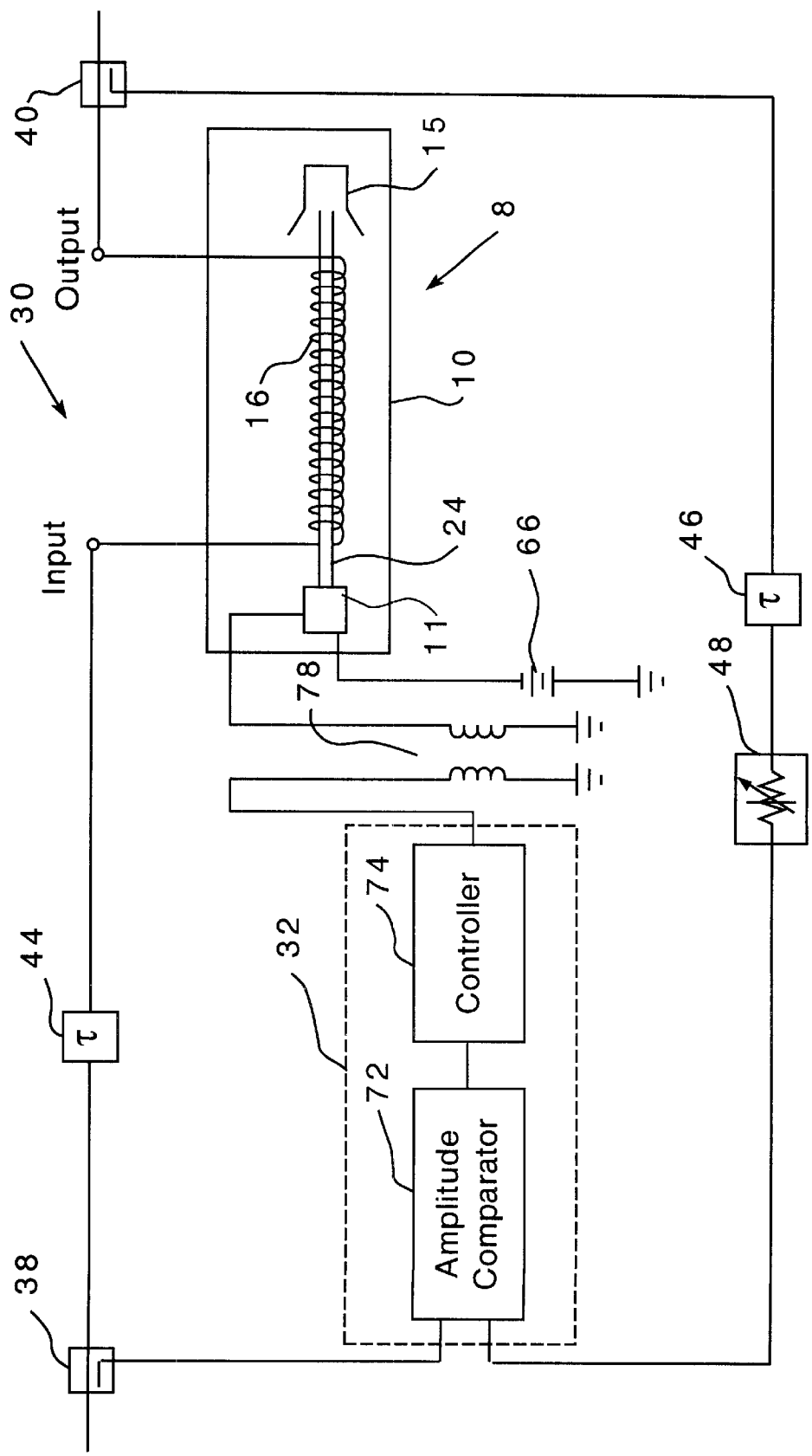

FIGS. 8 and 9 are diagrams of the amplifier system 30 showing different embodiments for the amplitude noise suppression circuit 32. For purposes of clarity, the phase noise suppression circuit 34 and the supplemental noise suppression circuit 36 are not shown in FIGS. 8 and 9.

In FIG. 8, the amplitude noise suppression circuit 32 includes an amplitude comparator 72 and a controller 74. The output of the amplitude noise suppression circuit 32 is coupled to a variable power source 76, which is coupled to the electron source 11 of the tube device 8. The amplitude comparator 72 has an input terminal coupled to each of the input and the output of the tube device 8, and outputs, for example, a DC voltage signal indicative of the amplitude difference between the two signals caused by the amplitude noise introduced by the tube device 8. Based on the input from the amplitude comparator 72, the controller 74 may output the appropriate control signal to the electron source 11, via the variable power source 76, to affect the current of the electron beam 24 generated by the electron source 11.

According to one embodiment, the controller 76 may be coupled to the focusing electrodes 22 of the electron source 11 to modulate the voltage of the focusing electrodes 22 relative to cathode 20 to control the current of the electron beam 24 to compensate for the amplitude noise introduced by the tube device 8. According to another embodiment, the output of the controller 76 may be coupled to the grid(s) 21. For such an embodiment, the control signal from the controller 76 may be a voltage signal which is applied to the grid(s) 21 to generate a voltage potential difference between the grid(s) 21 and the cathode 20 to dynamically compensate for the amplitude noise introduced by the tube device 8. The voltage of the signal applied to the grid(s) 21 may depend upon the distance between the grid(s) 21 and the cathode 20, and may be on the order of, for example, 10 V.

Similar to the controller 62 of the phase noise suppression circuit 34 described hereinbefore, the controller 74 may be, for example, a digital device, such as a DSP or an ASIC, or an analog device, such as, for example, a low noise solid state amplifier. For an embodiment in which the control signal output by the controller 74 is a voltage signal, the gain level of the controller 74 may depend upon the voltage of the output signal from the amplitude comparator 72 and the voltage required by either, for example, the focusing electrodes 22 or the grid(s) 21, to appropriately adjust the current of the electron beam 24. For example, if the signal output from the amplitude comparator 72 needs to be attenuated to apply the appropriate voltage to either the focusing electrodes 22 or the grid(s) 21, the controller 74 may have a negative gain (in terms of dB). Conversely, if the signal output from the amplitude comparator 72 needs to be amplified to apply the appropriate voltage to either the focusing electrodes 22 or the grid(s) 21, the controller 74 may have a positive gain. According to one embodiment, the controller 62 and the controller 74 may be embodied as a single device.

FIG. 9 is a diagram of the amplifier system 30 according to another embodiment of the present invention. The amplifier system 30 illustrated in FIG. 9 is similar to that illustrated in FIG. 8, except that the amplitude noise suppression circuit 32 modulates either the focusing electrodes 22 or the grid(s) 21 of the electron source 11 to affect the current of the electron beam 24 emitted by the electron source 11, as described hereinbefore, via an isolated transformer 78. The transformer 78 may include a primary winding coupled to the amplitude noise suppression circuit 32 and a secondary winding coupled to the electron source 11. A voltage across the primary winding from the amplitude noise suppression circuit 32 may be magnetically coupled to the secondary winding in proportion to the turns ratio between the primary and secondary windings of the transformer 78.

Figure 10:
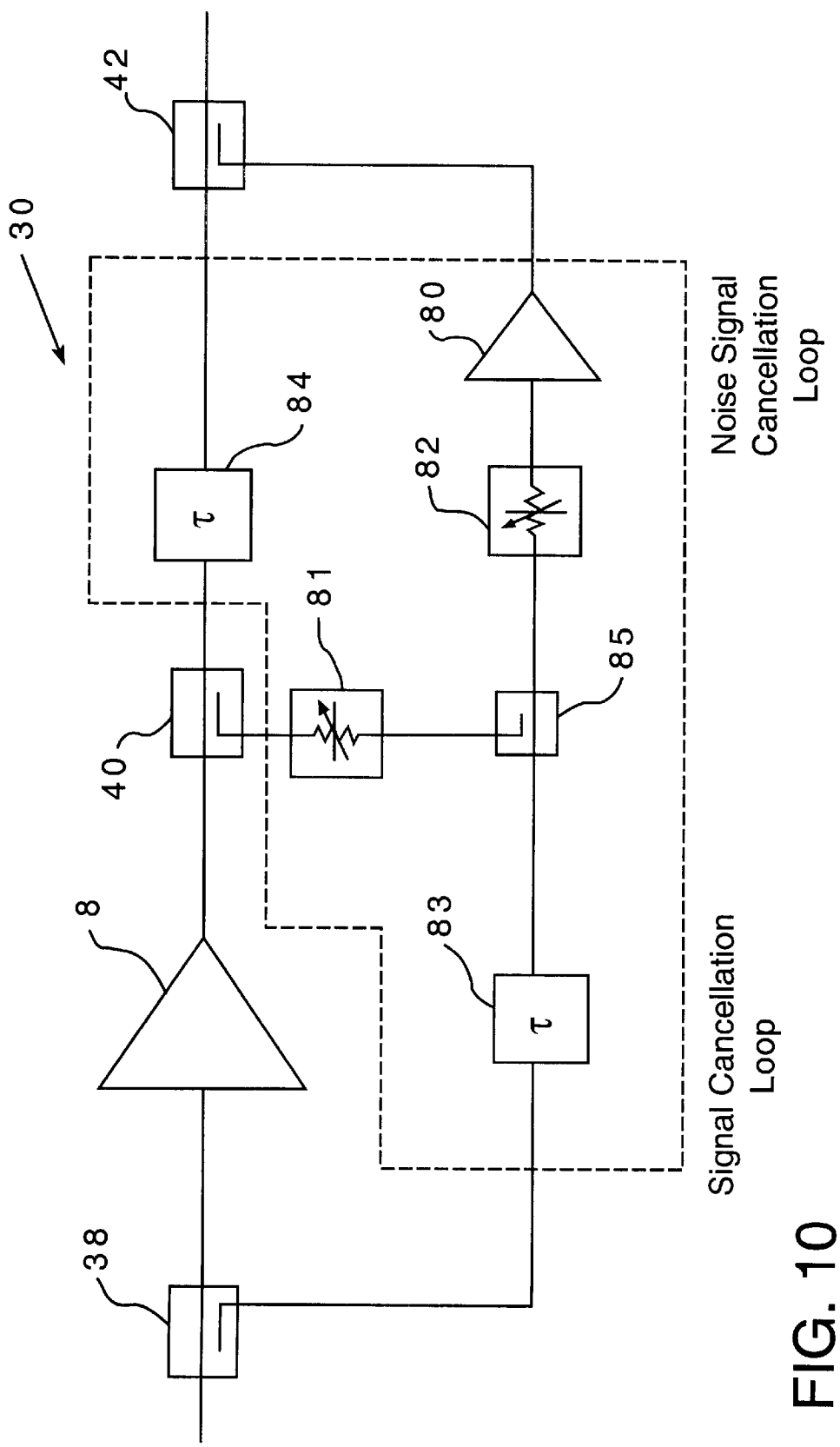
Figure 11:
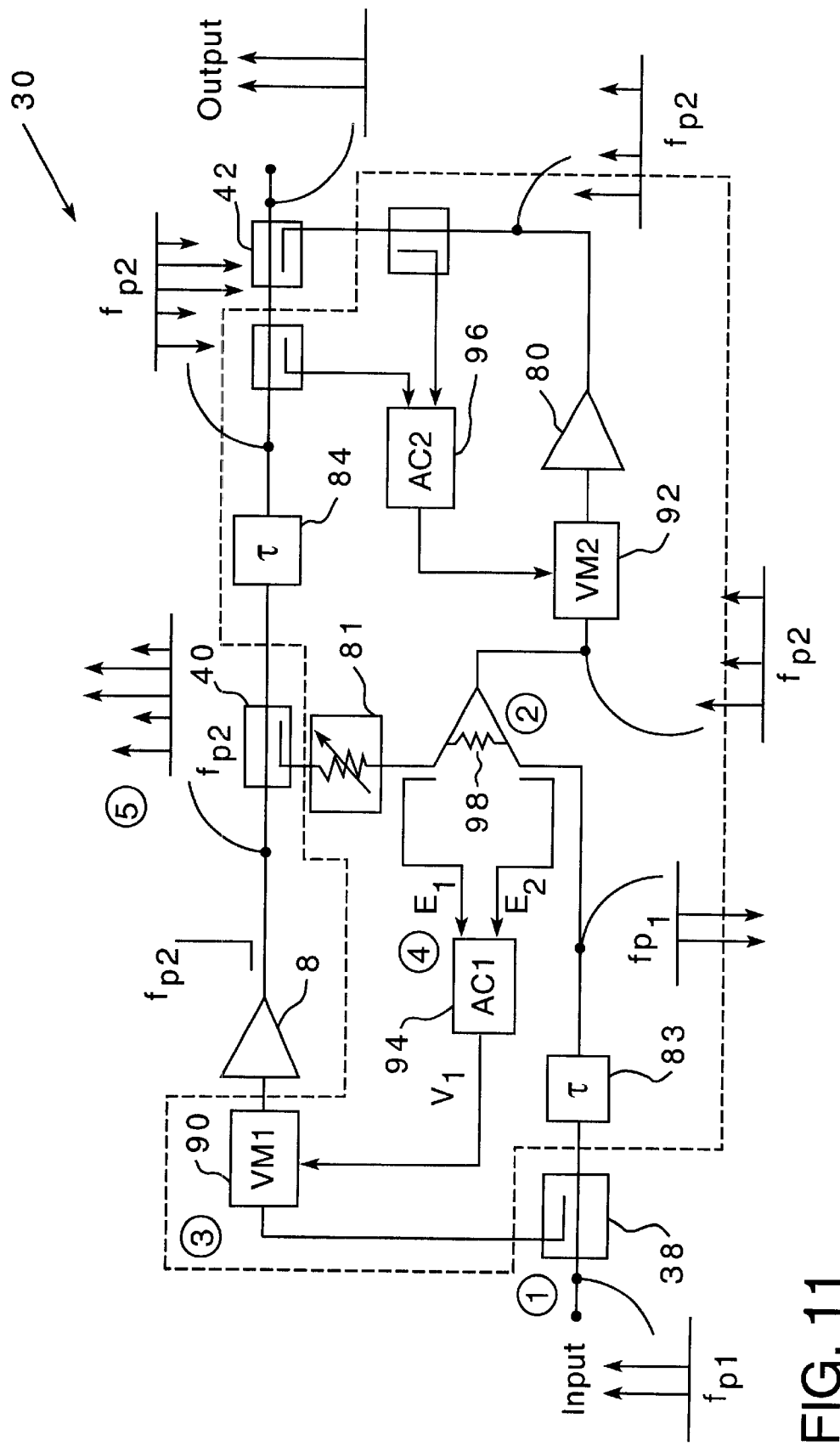
Figure 12:
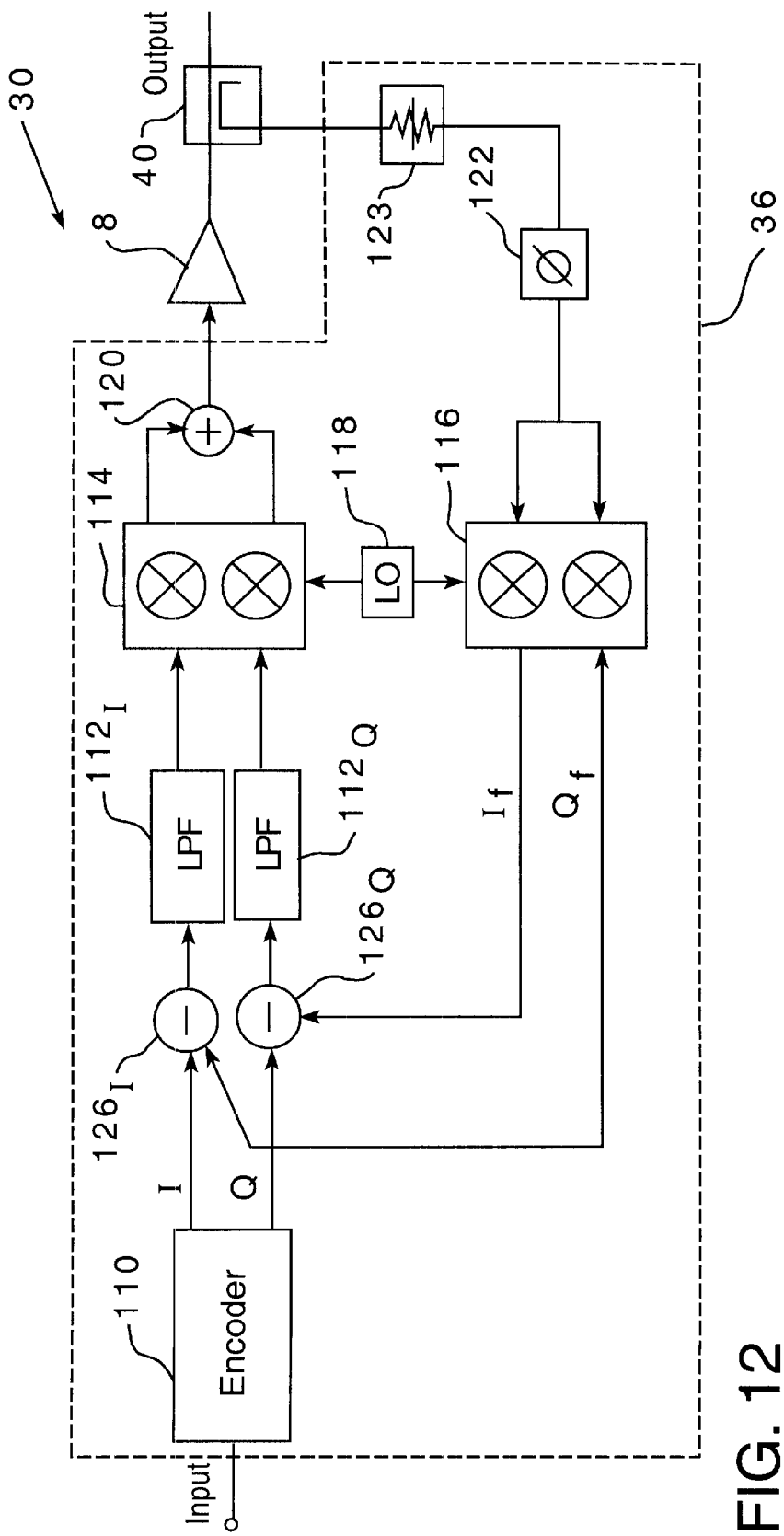

FIGS. 10–12 are diagrams of the amplifier system 30 illustrating different embodiments for the supplemental noise suppression circuit 36. For purposes of clarity, the amplitude noise suppression circuit 32 and the phase noise suppression circuit 34 are not shown in FIGS. 10–12. The tube device 8 is schematically shown in FIGS. 10–12 as an amplifier.

The supplemental noise suppression circuit 36 illustrated in FIG. 10 utilizes a non-adaptive feedforward technique, and includes an auxiliary amplifier 80 such as, for example, a low noise solid state amplifier, a pair of attenuators 81, 82, a pair of delay lines 83, 84, and a coupler 85. The feedforward noise suppression circuit 36 of FIG. 10 cancels noise introduced by the tube device 8 using two loops, the first being the signal cancellation loop and the second being the noise cancellation loop. The coupler 40 in the upper signal path samples part of the output from the tube device 8 and adds the signal to the lower signal path after appropriate attenuation by the attenuator 81. The delay line 83 may provide 180 degrees of phase difference with the upper signal path such that the signals add out of phase at the coupler 85. The resulting signal input to the attenuator 82 is thus only the noise distortion from the tube device 8.

In the second loop, the delay line 84 in the upper signal path may shift the signal 180 degrees out of phase with respect to the lower signal path. The attenuator 82 and the auxiliary amplifier 80 in the lower signal path may properly adjust the amplitude of the noise distortion components such that when the two signals are combined at the output coupler 42, the noise distortion components cancel.

FIG. 11 is a diagram illustrating the supplemental noise suppression circuit 36 according to another embodiment of the present invention. The supplemental noise suppression circuit 36 illustrated in FIG. 11 utilizes an adaptive feedforward technique to adaptively adjust for any variance in the performance of the tube device 8 or the auxiliary amplifier 80. The adaptive feedforward noise suppression circuit 36 includes a pair of vector modulators 90, 92, a pair of adaptive controllers 94, 96, and a Wilkinson combiner 98. The illustrated configuration uses pilot tones in the signal cancellation loop and a feedback path in each loop to monitor the cancellation junctions, such that variations in the gain of either amplifier (i.e., tube device 8 or auxiliary amplifier 80) may be adaptively accounted for. As seen at point 1, one of the main tones is used as the pilot tone, $f_{p1}$. This tone should be completely cancelled after the Wilkinson combiner 98 at point 2. The Wilkinson combiner may be, for example, a 3 dB coupler fabricated on microstrip.

The first vector modulator (VM1) 90 at point 3 may adjust the signal level such that the $f_{p1}$ components at each input to the Wilkinson combiner 98 have the same magnitude for proper cancellation. To adaptively adjust the first vector modulator 90, the signals at the inputs to the Wilkinson combiner 98 ($E_1$ and $E_2$) at point 4 are sampled and fed to the first adaptive controller (AC1) 94. The first adaptive controller 94 downconverts the signals to a lower frequency, digitizes, and filters each signal to monitor the $f_{p1}$ components. Fast Fourier transforms are performed on both signal paths by the first adaptive controller 94 to determine an amplitude ratio, which is converted back to analog. The analog output $V_1$ is then used as the adjustment for the first vector modulator 90. The second adaptive controller 96 works in a similar fashion with respect to a second pilot tone, $f_{p2}$, used for the noise cancellation loop.

According to another embodiment of the present invention, the supplemental noise suppression circuit 36 may employ a feedback technique. FIG. 12 is a diagram of the amplifier system 30 according to one embodiment of the present invention including a feedback noise suppression circuit 36. The noise suppression circuit 36 illustrated in FIG. 12 utilizes a Cartesian feedback technique, although according to other embodiments, different types of feedback techniques may be used.

The Cartesian feedback noise suppression circuit 36 includes an encoder 110, a pair of low pass filters $112_I$–$112_Q$, a quad-modulator 114, and a quad-demodulator 116. Each of the quad-modulator 1 14 and the quad-demodulator 116 receive a mixing signal from a local oscillator 118. The input signal (i.e., the signal to be amplified by the tube device 8) is input to the encoder 110, which produces a pair of bit streams I and Q on separate channels. The I and Q channels are filtered respectively with the low pass filters $112_I$ and $112_Q$, and quad-modulated by the quad-modulator 114. A combiner 120 sums the quad-modulated bit streams, which are input to the tube device 8. An upconverter (not shown) may be provided after the quad-modulator 114 to upconvert the frequencies of the signals input to the tube device 8 if necessary.

The directional coupler 40 at the output of the tube device 8 feeds a portion of the output signal of the tube device 8 to a feedback path. The feedback signal is phase and amplitude adjusted, by a phase shifter 122 and an attenuator 123 respectively, and quad-demodulated by the quad-demodulator 116 to retrieve the feedback bit streams ($I_f$ and $Q_f$). The $I_f$ and $Q_f$ signals are then input to subtracters $126_{I,Q}$ to be subtracted from the I and Q bit stream output from the encoder 110.

Figure 13:
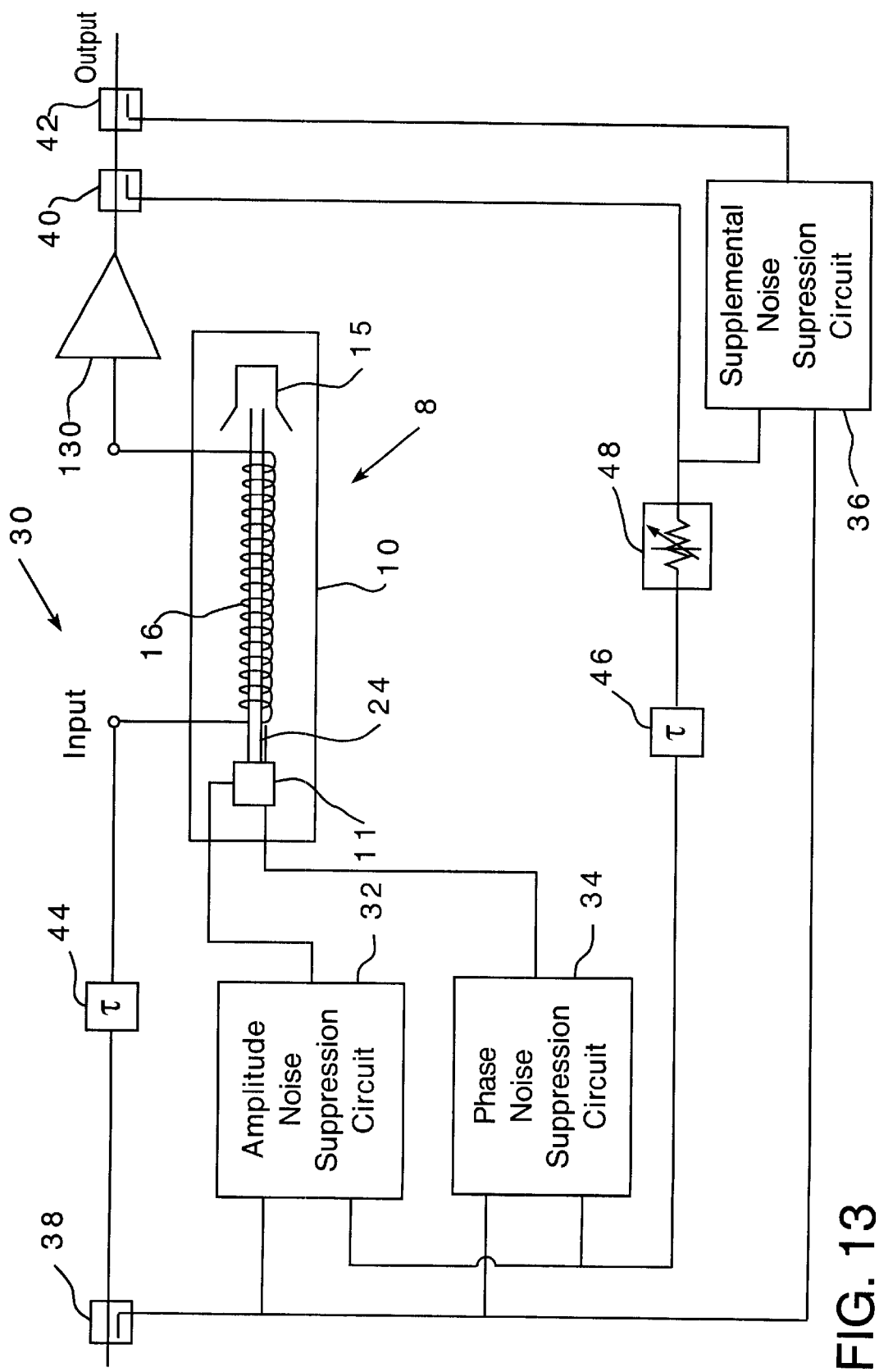

Benefits of the present invention may also be realized in connection with suppressing noise for a system of cascaded amplifiers. FIG. 13 is a diagram of the amplifier system 30 according to such an embodiment. The amplifier system 30 in FIG. 13 includes a second amplifier 130, which is driven by the tube device 8. The second amplifier 130 may be, for example, a high power vacuum tube amplifier or solid state amplifier. According to such an embodiment, the attenuation provided by the attenuator 48 and the coupler 40 may correspond to the gain provided by both of the tube device 8 and the second amplifier 130. As discussed hereinbefore with respect to FIGS. 4 and 5, the amplifier system 30 may be adaptive to compensate for variations in the gain provided by either the tube device 8 or the second amplifier 130. In addition, as discussed herein, the supplemental noise suppression circuit 36 may utilize, for example, a feedforward or feedback technique. The benefits of the present invention may be extended to more than two cascaded amplifiers in a similar fashion. However, if the cumulative time delay introduced by each amplification stage is too great, the bandwidth may not be sufficient for the feedback control.

Figure 14:
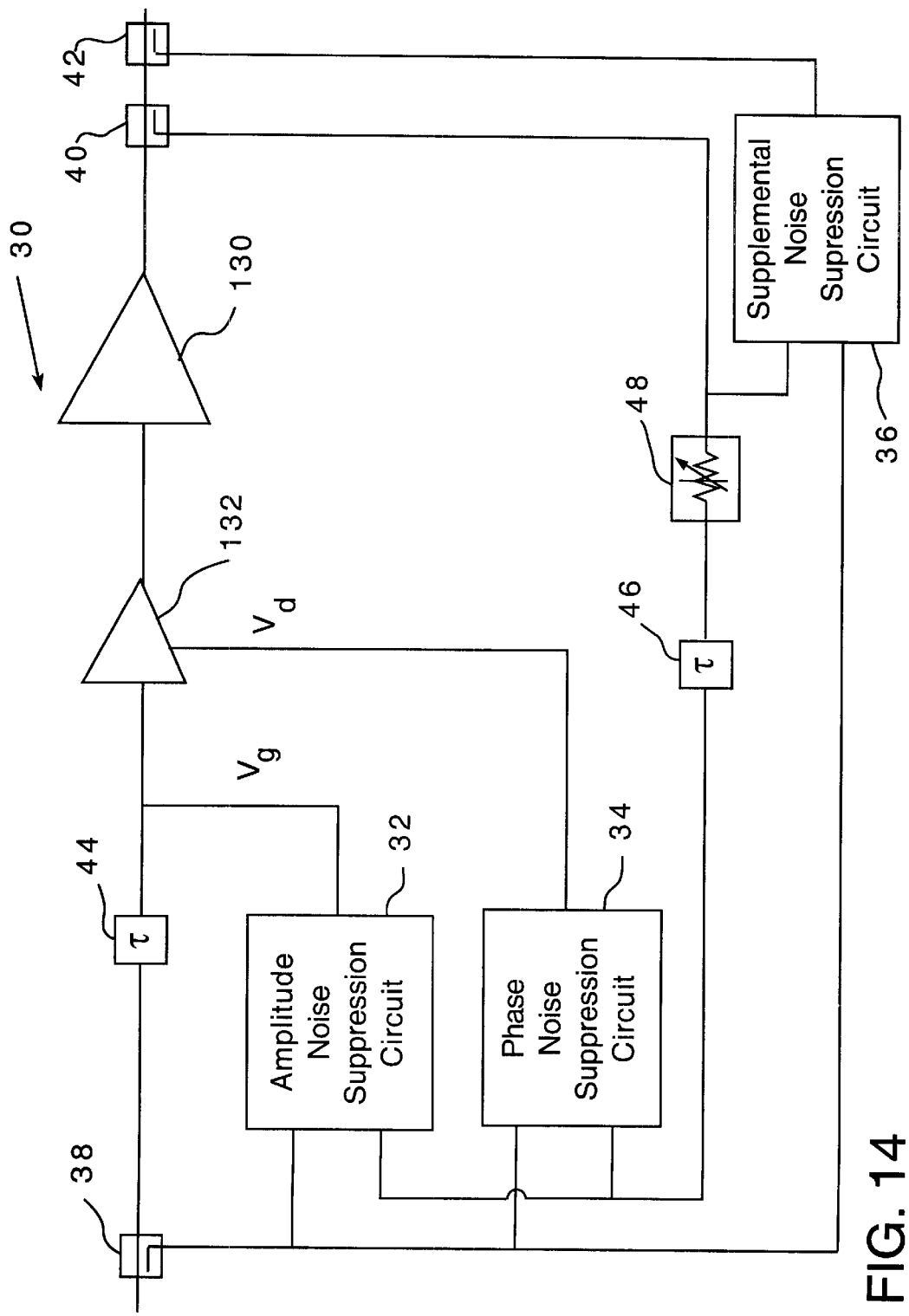

FIG. 14 is a diagram of another embodiment of the amplifier system 30 of the present invention in which a solid state amplifier 132 drives the second amplifier 130. The solid state amplifier 130 may be, for example, a field effect transistor (FET) configured according to, for example, a common-source or source-follower configuration. According to such an embodiment, the output terminal of the amplitude noise suppression circuit 32 may be coupled to the gate terminal of the FET 132 and the output terminal of the phase noise suppression circuit 34 may be coupled to the drain terminal of the FET 132. According to other embodiments, the amplifier system 30 of FIG. 14 may be extended in a similar fashion to more than two cascaded amplifiers.

According to such an embodiment, experimental results have shown that where the second amplifier 130 is a TWT, modulating the gate voltage of the FET 132 with the amplitude noise suppression circuit 32 by as little as ±0.09 V and modulating the drain voltage with the phase noise suppression circuit 34 by as little as ±2.2 V can compensate for amplitude and phase noise introduced by both the FET 132 and the second amplifier 130 up to ±1 dB in amplitude and ±2 degrees in phase. Thus, where for example the second amplifier is a 200 W TWT, noise may be compensated for up to a SNR level of 5.9 dB.

The advantage provided by the noise suppression techniques illustrated in FIGS. 13 and 14 for cascaded amplifier systems is that less expensive components can be used. Because the driving amplifier typically operates at a much lower power that the second amplifier 130, the components used to modulate the voltages at the driving amplifier (i.e., the tube device 8 in FIG. 13 or the solid state amplifier 132 in FIG. 14) may have a lower power rating than if they modulated voltages at the second amplifier 130.

Although the present invention has been described with regard to certain embodiments thereof, those of ordinary skill in the art will recognize that many modifications and variations of the present invention may be implemented. For example, the amplitude noise suppression and phase noise suppression circuits described hereinbefore may be embodied in a single device, such as one DSP or ASIC having an input terminal coupled to the input signal and outputting one or two control signals. According to such an embodiment, the DSP or ASIC may perform the functions of both the phase detector 60 and the amplitude comparator 72 and either or both of the controllers 62, 74. The foregoing description and the following claims are intended to cover all such modifications and variations.

What is claimed is:

1. An amplifier system, comprising:
   a vacuum tube amplifier having an input signal terminal and an output signal terminal;
   a phase noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of an electron source of the vacuum tube amplifier and an interaction region of the vacuum tube amplifier; and
   an amplitude noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of a focusing electrode of the electron source and a grid of the electron source.

2. An amplifier system, comprising:
   a vacuum tube amplifier having an input signal terminal and an output signal terminal;
   a phase noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of an electron source of the vacuum tube amplifier and an interaction region of the vacuum tube amplifier; and
   a supplemental noise suppression circuit coupled to both the input signal terminal and the output signal terminal of the vacuum tube amplifier.

3. The amplifier system of claim 2, wherein the supplemental noise suppression circuit includes a circuit selected from the group consisting of a feedforward noise suppression circuit and a feedback noise suppression circuit.

4. The amplifier system of claim 2, wherein the supplemental noise suppression circuit includes a feedforward noise suppression circuit selected from the group consisting of a non-adaptive feedforward noise suppression circuit and an adaptive feedforward noise suppression circuit.

5. The amplifier system of claim 2, wherein the phase noise suppression circuit includes:
   a phase detector having first and second input terminals and an output terminal, wherein the first input terminal is coupled to the input signal terminal of the vacuum tube amplifier, and the second input terminal is connected to the output signal terminal of the vacuum tube amplifier; and
   a controller having an input terminal and an output terminal, wherein the input terminal is coupled to the output terminal of the phase detector, and the output terminal is coupled to one of the electron source of the vacuum tube amplifier and the interaction region of the vacuum tube amplifier.

6. The amplifier system of claim 5, wherein the controller includes a low noise amplifier.

7. An amplifier system, comprising:
   a vacuum tube amplifier having an input signal terminal and an output signal terminal;
   a phase noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of an electron source of the vacuum tube amplifier and an interaction region of the vacuum tube amplifier, and wherein the phase noise suppression circuit includes:
   a phase detector having first and second input terminals and an output terminal, wherein the first input terminal is coupled to the input signal terminal of the vacuum tube amplifier, and the second input terminal is connected to the output signal terminal of the vacuum tube amplifier; and
   a controller having an input terminal and an output terminal, wherein the input terminal is coupled to the output terminal of the phase detector, and the output terminal is coupled to one of the electron source of the vacuum tube amplifier and the interaction region of the vacuum tube amplifier.

8. The amplifier system of claim 7, further comprising an amplitude noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of a focusing electrode of the electron source and a grid of the electron source.

9. The amplifier system of claim 7 further comprising a supplemental noise suppression circuit coupled to both the input signal terminal and the output signal terminal of the vacuum tube amplifier.

10. The amplifier system of claim 9, wherein the supplemental noise suppression circuit includes a circuit selected from the group consisting of a feedforward noise suppression circuit and a feedback noise suppression circuit.

11. The amplifier system of claim 9, wherein the supplemental noise suppression circuit includes a feedforward noise suppression circuit selected from the group consisting of a non-adaptive feedforward noise suppression circuit and an adaptive feedforward noise suppression circuit.

12. The amplifier system of claim 7, wherein the controller includes a low noise amplifier.

13. An amplifier system, comprising:
    a vacuum tube amplifier having an input signal terminal, an output signal terminal, an electron source;
    a phase noise suppression circuit responsive to both the input signal terminal and the output signal terminal for controlling a kinetic energy of electrons emitted by the electron source of the vacuum tube amplifier to suppress phase noise introduced by the vacuum tube amplifier; and
    an amplitude noise suppression circuit responsive to both the input signal terminal and the output signal terminal for controlling an amount of electrons emitted by the electron source of the vacuum tube amplifier to suppress amplitude noise introduced by the vacuum tube amplifier.

14. An amplifier system, comprising:
    a vacuum tube amplifier having an input signal terminal, an output signal terminal, an electron source;
    a phase noise suppression circuit responsive to both the input signal terminal and the output signal terminal for controlling a kinetic energy of electrons emitted by the electron source of the vacuum tube amplifier to suppress phase noise introduced by the vacuum tube amplifier; and a supplemental noise suppression circuit coupled to both the input signal terminal and the output signal terminal of the vacuum tube amplifier.

15. The amplifier system of claim 14, wherein the supplemental noise suppression circuit includes a selected from the group consisting of a feedforward noise suppression circuit and a feedback noise suppression circuit.

16. An amplifier system, comprising:

a vacuum tube amplifier having an electron source;

means for controlling a kinetic energy of electrons emitted by the electron source of the vacuum tube amplifier based on a phase difference between an input signal to vacuum tube amplifier and an output signal of the vacuum tube amplifier to compensate for phase noise introduced by the vacuum tube amplifier; and means for controlling an amount of electrons emitted by the electron source of the vacuum tube amplifier based on an amplitude difference between an input signal to vacuum tube amplifier and an output signal of the vacuum tube amplifier to compensate for amplitude noise introduced by the vacuum tube amplifier.

17. An amplifier system, comprising:

a vacuum tube amplifier having an electron source;

means for controlling a kinetic energy of electrons emitted by the electron source of the vacuum tube amplifier based on a phase difference between an input signal to vacuum tube amplifier and an output signal of the vacuum tube amplifier to compensate for phase noise introduced by the vacuum tube amplifier; and means for canceling noise distortion components at one of an input and an output of the vacuum tube amplifier.

18. An amplifier system, comprising:

a vacuum tube amplifier having an input signal terminal, an output signal terminal, and an electron source; and an amplitude noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to the electron source of the vacuum tube amplifier, and wherein the output terminal of the amplitude noise suppression circuit is connected to one of a focusing electrode of the electron source and a grid of the electron source.

19. An amplifier system, comprising:

a vacuum tube amplifier having an input signal terminal, an output signal terminal, and an electron source;

an amplitude noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to the electron source of the vacuum tube amplifier; and a supplemental noise suppression circuit coupled to both the input signal terminal and the output signal terminal of the vacuum tube amplifier.

20. The amplifier system of claim 19, wherein the supplemental noise suppression circuit includes a circuit selected from the group consisting of a feedforward noise suppression circuit and a feedback noise suppression circuit.

21. The amplifier system of claim 19, wherein the amplitude noise suppression circuit includes:

an amplitude comparator having first and second input terminals and an output terminal, wherein the first input terminal is coupled to the input signal terminal of the vacuum tube amplifier, and the second input terminal is coupled to the output signal terminal of the vacuum tube amplifier; and a controller having an input terminal and an output terminal, wherein the input terminal is coupled to the output terminal of the amplitude comparator, and the output terminal is coupled to the electron source.

22. The amplifier system of claim 21, wherein the controller includes a low noise amplifier.

23. The amplifier system of claim 21, wherein the output terminal of the controller is coupled to the electron source via a transformer.

24. An amplifier system, comprising:

a vacuum tube amplifier having an input signal terminal, an output signal terminal, and an electron source; and an amplitude noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to the electron source of the vacuum tube amplifier, and wherein the amplitude noise suppression circuit includes:

an amplitude comparator having first and second input terminals and an output terminal, wherein the first input terminal is coupled to the input signal terminal of the vacuum tube amplifier, and the second input terminal is coupled to the output signal terminal of the vacuum tube amplifier; and a controller having an input terminal and an output terminal, wherein the input terminal is coupled to the output terminal of the amplitude comparator, and the output terminal is coupled to the electron source.

25. The amplifier system of claim 24, wherein the output terminal of the amplitude noise suppression circuit is connected to one of a focusing electrode of the electron source and a grid of the electron source.

26. The amplifier system of claim 24, further comprising a supplemental noise suppression circuit coupled to both the input signal terminal and the output signal terminal of the vacuum tube amplifier.

27. The amplifier system of claim 26, wherein the supplemental noise suppression circuit includes a circuit selected from the group consisting of a feedforward noise suppression circuit and a feedback noise suppression circuit.

28. The amplifier system of claim 24, wherein the controller includes a low noise amplifier.

29. The amplifier system of claim 24, wherein the output terminal of the controller is coupled to the electron source via a transformer.

30. An amplifier system, comprising:

a vacuum tube amplifier having an input signal terminal, an output signal terminal, an electron source;

an amplitude noise suppression circuit responsive to both the input signal terminal and the output signal terminal for controlling an amount of electrons emitted by the electron source of the vacuum tube amplifier to suppress amplitude noise introduced by the vacuum tube amplifier; and a supplemental noise suppression circuit coupled to both the input signal terminal and the output signal terminal of the vacuum tube amplifier.

31. An amplifier system, comprising:

a vacuum tube amplifier having an electron source;

means for controlling an amount of electrons emitted by the electron source of the vacuum tube amplifier based on a amplitude difference between an input signal to vacuum tube amplifier and an output signal of the vacuum tube amplifier to compensate for amplitude noise introduced by the vacuum tube amplifier; and means for canceling noise distortion components at one of an input and an output of the vacuum tube amplifier.

32. A method for suppressing noise introduced by a vacuum tube amplifier, comprising:

detecting a phase difference between an input signal to the vacuum tube amplifier and an output signal from the vacuum tube amplifier indicative of phase noise introduced by the vacuum tube amplifier;

adjusting a kinetic energy of electrons emitted by an electron source of the vacuum tube amplifier based on the detected phase difference;

detecting an amplitude difference between an input signal to the vacuum tube amplifier and an output signal from the vacuum tube amplifier indicative of amplitude noise introduced by the vacuum tube amplifier; and adjusting an amount of electrons emitted by the electron source of the vacuum tube amplifier based on the detected amplitude difference.

33. The amplifier system of claim 2 further comprising an amplitude noise suppression circuit having first and second input terminals and an output terminal, wherein the first input terminal is coupled to the input signal terminal of the vacuum tube amplifier, the second input terminal is coupled to the output signal terminal of the vacuum tube amplifier, and the output terminal is coupled to one of a focusing electrode of the electron source and a grid of the electron source.

34. The amplifier system of claim 8, further comprising a supplemental noise suppression circuit coupled to both the input signal terminal and the output signal terminal of the vacuum tube amplifier.

35. The amplifier system of claim 1, further comprising a supplemental noise suppression circuit coupled to both the input signal terminal and the output signal terminal of the vacuum tube amplifier.

36. The amplifier system of claim 35, wherein the supplemental noise suppression circuit includes a circuit selected from the group consisting of a feedforward noise suppression circuit and a feedback noise suppression circuit.

37. The amplifier system of claim 35, wherein the supplemental noise suppression circuit includes a feedforward noise suppression circuit selected from the group consisting of a non-adaptive feedforward noise suppression circuit and an adaptive feedforward noise suppression circuit.

38. The amplifier system of claim 1, wherein the phase noise suppression circuit includes:

a phase detector having first and second input terminals and an output terminal, wherein the first input terminal is coupled to the input signal terminal of the vacuum tube amplifier, and the second input terminal is connected to the output signal terminal of the vacuum tube amplifier; and a controller having an input terminal and an output terminal, wherein the input terminal is coupled to the output terminal of the phase detector, and the output terminal is coupled to one of the electron source of the vacuum tube amplifier and the interaction region of the vacuum tube amplifier.

39. The amplifier system of claim 38 wherein the controller includes a low noise amplifier.

40. The amplifier system of claim 14, further comprising an amplitude noise suppression circuit responsive to both the input signal terminal and the output signal terminal for controlling an amount of electrons emitted by the electron source of the vacuum tube amplifier to suppress amplitude noise introduced by the vacuum tube amplifier.

41. The amplifier system of claim 13, further comprising a supplemental noise suppression circuit coupled to both the input signal terminal and the output signal terminal of the vacuum tube amplifier.

42. The amplifier system of claim 41, wherein the supplemental noise suppression circuit includes a selected from the group consisting of a feedforward noise suppression circuit and a feedback noise suppression circuit.

43. The amplifier system of claim 15, further comprising means for controlling an amount of electrons emitted by the electron source of the vacuum tube amplifier based on an amplitude difference between an input signal to vacuum tube amplifier and an output signal of the vacuum tube amplifier to compensate for amplitude noise introduced by the vacuum tube amplifier.

44. The amplifier system of claim 10, further comprising means for canceling noise distortion components at one of an input and an output of the vacuum tube amplifier.

45. The amplifier system of claim 14, wherein the output terminal of the amplitude noise suppression circuit is connected to one of a focusing electrode of the electron source and a grid of the electron source.

46. The amplifier system of claim 18, further comprising a supplemental noise suppression circuit coupled to both the input signal terminal and the output signal terminal of the vacuum tube amplifier.

47. The amplifier system of claim 46, wherein the supplemental noise suppression circuit includes a circuit selected from the group consisting of a feedforward noise suppression circuit and a feedback noise suppression circuit.

48. The amplifier system of claim 18, wherein the amplitude noise suppression circuit includes:

an amplitude comparator having first and second input terminals and an output terminal, wherein the first input terminal is coupled to the input signal terminal of the vacuum tube amplifier, and the second input terminal is coupled to the output signal terminal of the vacuum tube amplifier; and a controller having an input terminal and an output terminal, wherein the input terminal is coupled to the output terminal of the amplitude comparator, and the output terminal is coupled to the electron source.

49. The amplifier system of claim 48, wherein the controller includes a low noise amplifier.

50. The amplifier system of claim 48, wherein the output terminal of the controller is coupled to the electron source via a transformer.

51. The amplifier system of claim 30, wherein the supplemental noise suppression circuit includes a circuit selected from the group consisting of a feedforward noise suppression circuit and a feedback noise suppression circuit.

* * * * *